US011521799B2

(12) United States Patent
Chikuma

(10) Patent No.: US 11,521,799 B2
(45) Date of Patent: Dec. 6, 2022

(54) SUPPORTING-TERMINAL-EQUIPPED CAPACITOR CHIP AND MOUNTED STRUCTURE THEREOF

(71) Applicant: Murata Manufacturing Co., Ltd., Nagaokakyo (JP)

(72) Inventor: Shinobu Chikuma, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/075,746

(22) Filed: Oct. 21, 2020

(65) Prior Publication Data

US 2021/0125786 A1    Apr. 29, 2021

(30) Foreign Application Priority Data

Oct. 28, 2019    (JP) ............................. JP2019-195047

(51) Int. Cl.
| | | |
|---|---|---|
| H01G 2/06 | (2006.01) | |
| H01G 4/008 | (2006.01) | |
| H01G 4/012 | (2006.01) | |
| H01G 4/12 | (2006.01) | |
| H01G 4/232 | (2006.01) | |
| H01G 4/30 | (2006.01) | |

(52) U.S. Cl.
CPC ............... *H01G 4/30* (2013.01); *H01G 2/065* (2013.01); *H01G 4/008* (2013.01); *H01G 4/012* (2013.01); *H01G 4/1209* (2013.01); *H01G 4/232* (2013.01)

(58) Field of Classification Search
CPC ........ H01G 2/065; H01G 4/008; H01G 4/012; H01G 4/1209; H01G 4/1218; H01G 4/232; H01G 4/2325; H01G 4/30; H05K 1/181; H05K 3/3426
See application file for complete search history.

(56) References Cited

U.S. PATENT DOCUMENTS

| | | | |
|---|---|---|---|
| 9,775,244 B2* | 9/2017 | Park ........................ | H01G 4/228 |
| 10,074,481 B2* | 9/2018 | Park ........................ | H01G 2/06 |
| 2002/0056922 A1* | 5/2002 | Funaya .................... | H01L 24/11 |
| | | | 438/117 |
| 2003/0176083 A1* | 9/2003 | Li ........................ | H01R 13/2421 |
| | | | 439/66 |
| 2004/0075168 A1* | 4/2004 | Azuma .................... | H01L 24/13 |
| | | | 257/E21.511 |
| 2016/0307700 A1* | 10/2016 | Park ........................ | H01G 4/228 |
| 2018/0145042 A1* | 5/2018 | Lim ...................... | H01L 23/3157 |
| 2021/0127493 A1* | 4/2021 | Chikuma ............... | H01G 4/232 |

FOREIGN PATENT DOCUMENTS

| | | | |
|---|---|---|---|
| JP | 2012-033652 A | | 2/2012 |
| JP | 2012033652 A | * | 2/2012 |
| JP | 2012033654 A | * | 2/2012 |

\* cited by examiner

*Primary Examiner* — Nathan Milakovich
(74) *Attorney, Agent, or Firm* — Keating & Bennett, LLP

(57) ABSTRACT

Each of a supporting-terminal-equipped capacitor chip and a mounted structure thereof includes a capacitor chip and first and second supporting terminals that each have electric conductivity. A maximum diameter size of the first supporting terminal when viewed in an axial direction is larger than a maximum length size of a portion of a first outer electrode on a second main surface in a length direction. A maximum diameter size of the second supporting terminal when viewed in the axial direction is larger than a maximum length size of a portion of a second outer electrode on the second main surface in the length direction.

18 Claims, 7 Drawing Sheets

SUPPORTING-TERMINAL-EQUIPPED CAPACITOR CHIP AND MOUNTED STRUCTURE THEREOF

CROSS REFERENCE TO RELATED APPLICATIONS

This application claims the benefit of priority to Japanese Patent Application No. 2019-195047 filed on Oct. 28, 2019. The entire contents of this application are hereby incorporated herein by reference.

BACKGROUND OF THE INVENTION

1. Field of the Invention

The present invention relates to a supporting-terminal-equipped capacitor chip and a mounted structure thereof.

2. Description of the Related Art

As a prior art document, Japanese Patent Laid-Open No. 2012-33652 discloses a ceramic capacitor to reduce acoustic noise generated in a circuit board. A multilayer ceramic capacitor described in Japanese Patent Laid-Open No. 2012-33652 includes a ceramic capacitor element and a connection terminal. The ceramic capacitor element has an outer electrode. The connection terminal connects the outer electrode to the circuit board. The connection terminal has a coil spring that has one end connected to the outer electrode side and the other end connected to the circuit board side.

Since the coil spring of the connection terminal in the ceramic capacitor described in Japanese Patent Laid-Open No. 2012-33652 has a small maximum diameter size, stability in supporting the ceramic capacitor element is insufficient. To address this, a plurality of coil springs are connected to one outer electrode and an electrode plate is disposed between each coil spring and the circuit board. This results in a complicated configuration.

SUMMARY OF THE INVENTION

Preferred embodiments of the present invention provide supporting-terminal-equipped capacitor chips and mounted structures thereof, each having a simple structure that enables a capacitor chip to be stably supported while reducing acoustic noise.

A mounted structure of a supporting-terminal-equipped capacitor chip according to a preferred embodiment of the present invention includes: a capacitor chip; a first supporting terminal and a second supporting terminal that each have electric conductivity; and a circuit board. Each of the first supporting terminal and the second supporting terminal supports the capacitor chip and extends helically along an axial direction. The circuit board includes a first land connected to the first supporting terminal and a second land connected to the second supporting terminal. The capacitor chip includes a multilayer body, a first outer electrode, and a second outer electrode. The multilayer body includes a plurality of dielectric layers and a plurality of inner electrode layers alternately layered. The multilayer body includes: a first main surface and a second main surface facing each other in a height direction; a first side surface and a second side surface facing each other in a width direction orthogonal or substantially orthogonal to the height direction; and a first end surface and a second end surface facing each other in a length direction orthogonal or substantially orthogonal to both the height direction and the width direction. Each of the first outer electrode and the second outer electrode is provided at least on the second main surface. The second main surface faces the circuit board. The plurality of inner electrode layers include a first inner electrode layer connected to the first outer electrode and a second inner electrode layer connected to the second outer electrode. A first loop-shaped first end portion of the first supporting terminal on a first end side in the axial direction is connected to the first outer electrode, and a first loop-shaped second end portion of the first supporting terminal on a second end side in the axial direction is directly connected to the first land by a first electrically conductive bonding material. A second loop-shaped first end portion of the second supporting terminal on a first end side in the axial direction is connected to the second outer electrode, and a second loop-shaped second end portion of the second supporting terminal on a second end side in the axial direction is directly connected to the second land by a second electrically conductive bonding material. A maximum diameter size of the first supporting terminal when viewed in the axial direction is larger than a maximum length size of a portion of the first outer electrode on the second main surface in the length direction. A maximum diameter size of the second supporting terminal when viewed in the axial direction is larger than a maximum length size of a portion of the second outer electrode on the second main surface in the length direction.

A supporting-terminal-equipped capacitor chip according to a preferred embodiment of the present invention includes: a capacitor chip; and a first supporting terminal and a second supporting terminal that each have electric conductivity. Each of the first supporting terminal and the second supporting terminal supports the capacitor chip and extends helically along the axial direction. The capacitor chip includes a multilayer body, a first outer electrode, and a second outer electrode. The multilayer body includes a plurality of dielectric layers and a plurality of inner electrode layers alternately layered. The multilayer body includes: a first main surface and a second main surface facing each other in a height direction; a first side surface and a second side surface facing each other in a width direction orthogonal or substantially orthogonal to the height direction; and a first end surface and a second end surface facing each other in a length direction orthogonal or substantially orthogonal to both the height direction and the width direction. Each of the first outer electrode and the second outer electrode is provided at least on the second main surface. The plurality of inner electrode layers include a first inner electrode layer connected to the first outer electrode and a second inner electrode layer connected to the second outer electrode. A first loop-shaped first end portion of the first supporting terminal in the axial direction is connected to the first outer electrode. A second loop-shaped first end portion of the second supporting terminal in the axial direction is connected to the second outer electrode. A maximum diameter size of the first supporting terminal when viewed in the axial direction is larger than a maximum length size of a portion of the first outer electrode on the second main surface in the length direction. A maximum diameter size of the second supporting terminal when viewed in the axial direction is larger than a maximum length size of a portion of the second outer electrode on the second main surface in the length direction.

The above and other elements, features, steps, characteristics and advantages of the present invention will become

DETAILED DESCRIPTION OF THE PREFERRED EMBODIMENTS

Figure 1:
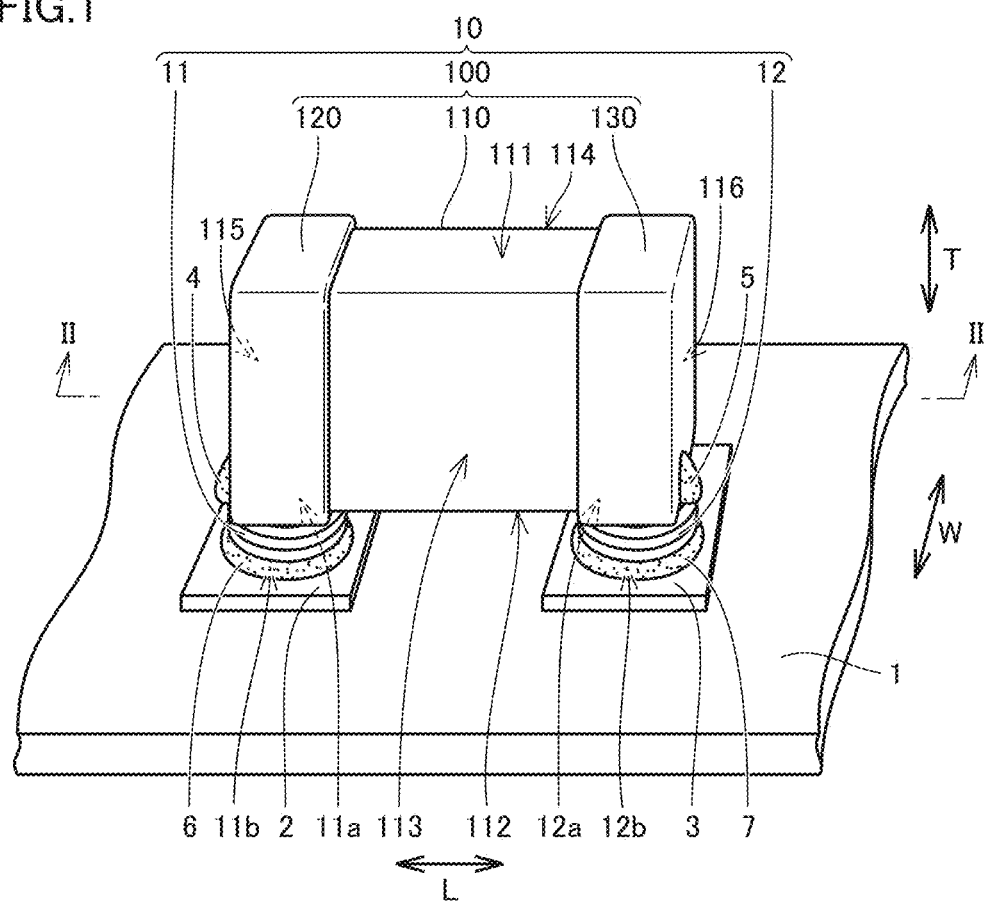
FIG. 1 is a perspective view showing a mounted structure of a supporting-terminal-equipped capacitor chip according to a first preferred embodiment of the present invention.

Hereinafter, supporting-terminal-equipped capacitor chips and mounted structures thereof according to preferred embodiments of the present invention will be described with reference to the figures. In the following description of the preferred embodiments, the same or corresponding portions in the figures are denoted by the same reference characters, and will not be described repeatedly.

Figure 2:
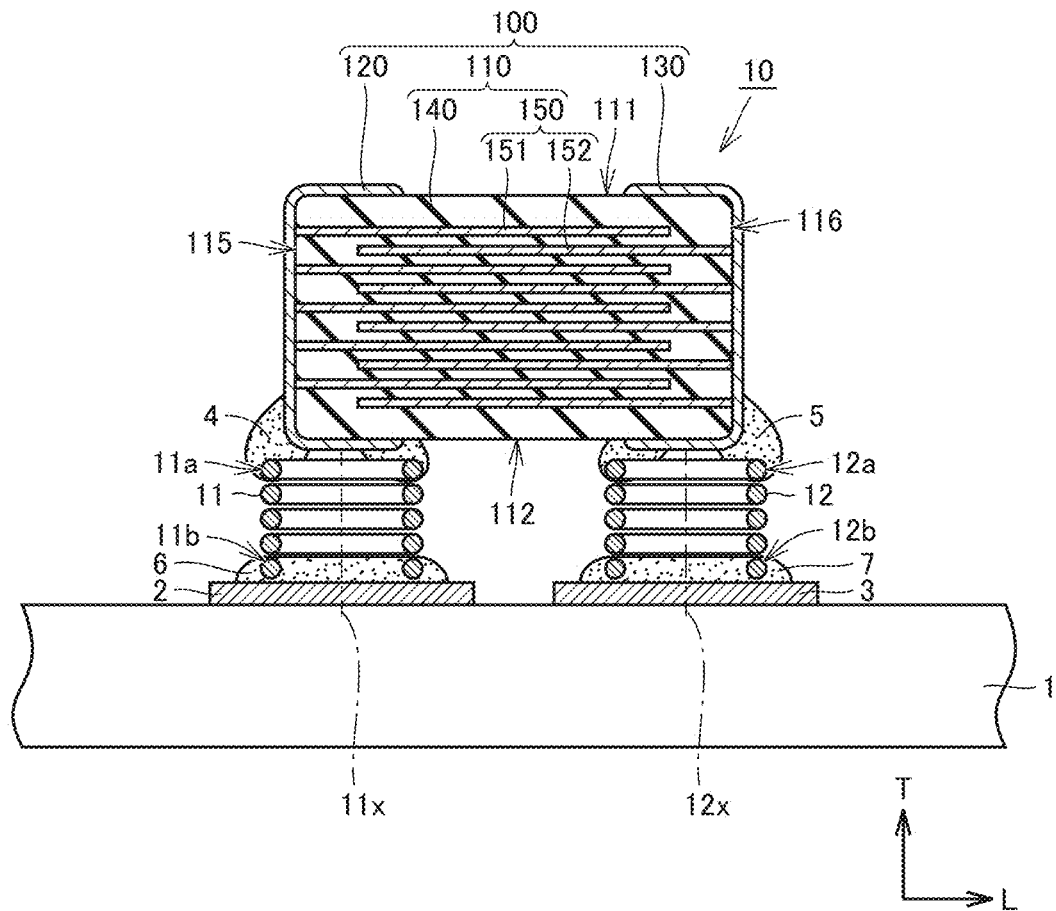
FIG. 2 is a cross sectional view showing the mounted structure of the supporting-terminal-equipped capacitor chip of FIG. 1 when viewed in a direction of a line arrow II-II.

FIG. 1 is a perspective view showing a mounted structure of a supporting-terminal-equipped capacitor chip according to a first preferred embodiment of the present invention. FIG. 2 is a cross sectional view showing the mounted structure of the supporting-terminal-equipped capacitor chip of FIG. 1 when viewed in a direction of a line arrow II-II.

As shown in FIGS. 1 and 2, a mounted structure of a supporting-terminal-equipped capacitor chip 10 according to the first preferred embodiment of the present invention includes a capacitor chip 100, only one first supporting terminal 11, only one second supporting terminal 12, and a circuit board 1. Each of the number of first supporting terminals 11 and the number of second supporting terminals 12 is not limited to one. A plurality of first supporting terminals 11 and a plurality of second supporting terminals 12 may be provided.

Capacitor chip 100 includes a multilayer body 110, a first outer electrode 120, and a second outer electrode 130. Multilayer body 110 includes a plurality of dielectric layers 140 and a plurality of inner electrode layers 150, which are alternately layered along a height direction T.

Multilayer body 110 includes: a first main surface 111 and a second main surface 112 facing each other in height direction T; a first side surface 113 and a second side surface 114 facing each other in a width direction W orthogonal or substantially orthogonal to height direction T; and a first end surface 115 and a second end surface 116 facing each other in a length direction L orthogonal or substantially orthogonal to both height direction T and width direction W. Second main surface 112 faces circuit board 1.

First outer electrode 120 extends from first end surface 115 onto second main surface 112. In the first preferred embodiment, first outer electrode 120 is formed on the whole of first end surface 115 of multilayer body 110 and is formed to extend from first end surface 115 onto first main surface 111, second main surface 112, first side surface 113, and second side surface 114. The first outer electrode 120 may be provided at least on second main surface 112.

Second outer electrode 130 extends from second end surface 116 onto second main surface 112. In the first preferred embodiment, second outer electrode 130 is formed on the whole of second end surface 116 of multilayer body 110 and is formed to extend from second end surface 116 onto first main surface 111, second main surface 112, first side surface 113, and second side surface 114. The second outer electrode 130 may be provided at least on second main surface 112.

The plurality of inner electrode layers 150 include: a plurality of first inner electrode layers 151 connected to first outer electrode 120; and a plurality of second inner electrode layers 152 connected to second outer electrode 130. FIG. 2 illustrates an example in which five first inner electrode layers 151 and five second inner electrode layers 152 are provided; however, each of the number of first inner electrode layers 151 and the number of second inner electrode layers 152 is not limited to five. In the first preferred embodiment, the layering direction of the plurality of inner electrode layers 150 is along height direction T, but may be along width direction W.

In the first preferred embodiment, the size of multilayer body 110 in length direction L is preferably more than or equal to about 1.0 mm, the size of multilayer body 110 in width direction W is preferably more than or equal to about 0.5 mm, and the size of multilayer body 110 in height direction T is preferably more than or equal to about 0.5 mm, for example. The size of multilayer body 110 in length direction L and the size of multilayer body 110 in width direction W are sizes at the central portion of multilayer body 110 in height direction T, and the size of multilayer body 110 in height direction T is a size at the central portion of multilayer body 110 in length direction L. The sizes of multilayer body 110 are able to be measured using a micrometer or an optical microscope.

Multilayer body 110 preferably has rounded corner portions and ridgeline portions, for example. Each of the corner portions is a portion at which three surfaces of multilayer body 110 intersect one another. Each of the ridgeline portions is a portion at which two surfaces of multilayer body 110 intersect each other.

The thickness of a dielectric layer 140 between a first inner electrode layer 151 and a second inner electrode layer 152 is preferably more than or equal to about 0.5 μm and less than or equal to about 10 μm, for example. Each of the thickness of a dielectric layer 140 defining first main surface 111 and adjacent to an inner electrode layer closest to first main surface 111 among the plurality of inner electrode layers 150 and the thickness of a dielectric layer 140 defining second main surface 112 and adjacent to the inner electrode layer closest to second main surface 112 among the plurality of inner electrode layers 150 is preferably more than or equal to about 100 μm and less than or equal to about 200 μm, for example. The thickness of each dielectric layer 140 is a size at the central portion of multilayer body 110 in width direction W.

Each of the plurality of dielectric layers 140 includes, as a main component, dielectric particles each having a perovskite structure including at least Ti, for example, $BaTiO_3$, $CaTiO_3$, or $SrTiO_3$. In addition to the main component, an accessory component having a content smaller than that of the main component may be included therein. The accessory component is at least one of a Mn compound, a Mg compound, a Si compound, a Fe compound, a Cr compound, a Co compound, a Ni compound, an Al compound, a V compound, and a rare earth compound. The dielectric constant of the material of dielectric layer 140 is preferably more than or equal to about 1000, for example.

The thickness of each of first inner electrode layer 151 and second inner electrode layer 152 is preferably more than or equal to about 0.2 μm and less than or equal to about 2.0 μm, for example. As a material of each of first inner electrode layer 151 and second inner electrode layer 152, one metal selected from a group of Ni, Cu, Ag, Pd, and Au, or an alloy including the metal may be included. For example, an alloy of Ag and Pd or the like may be included. Each of first inner electrode layer 151 and second inner electrode layer 152 may include dielectric particles having the same composition as or a similar composition to that of a dielectric ceramic included in dielectric layer 140.

The thickness of each of dielectric layer 140, first inner electrode layer 151, and second inner electrode layer 152 is able to be measured by the following method.

First, a surface of multilayer body 110 defined by height direction T and width direction W, that is, a surface of multilayer body 110 orthogonal or substantially orthogonal to length direction L is exposed by grinding. The exposed cross section is observed by a scanning electron microscope. Next, the thickness of dielectric layer 140 is measured on a total of the following five lines: a central line extending through the center of the exposed cross section along height direction T; two lines at equal or substantially equal intervals on one side with respect to the center line; and two lines at equal or substantially equal intervals on the other side with respect to the center line. The average value of the five measured values is regarded as the thickness of dielectric layer 140.

The thickness of each of first inner electrode layer 151 and second inner electrode layer 152 is also able to be measured using a scanning electron microscope in the same cross section as the cross section in which the thickness of dielectric layer 140 is measured, similar to the method for measuring the thickness of dielectric layer 140.

Each of first outer electrode 120 and second outer electrode 130 includes, for example, an underlying electrode layer and a plating layer provided on the underlying electrode layer. The underlying electrode layer includes at least one of a baked electrode layer, a resin electrode layer, a thin film electrode layer, and the like.

The baked electrode layer is a layer including glass and a metal. One baked electrode layer or a plurality of baked electrode layers may be provided. The baked electrode layer includes, for example, one metal selected from a group consisting of Ni, Cu, Ag, Pd and Au, or an alloy including the metal. For example, the baked electrode includes an alloy of Ag and Pd, or the like.

The baked electrode layer is formed by applying an electrically conductive paste including the glass and the metal onto multilayer body 110 and performing baking thereto. The baking may be performed simultaneously with calcination of multilayer body 110 or may be performed after the calcination of multilayer body 110.

The resin electrode layer is able to be formed as a layer including electrically conductive particles and a thermosetting resin, for example. In the case of forming the resin electrode layer, the resin electrode layer may be directly formed on the multilayer body without forming the baked electrode layer. One resin electrode layer or a plurality of resin electrode layers may be provided.

The thin film electrode layer is a layer of less than or equal to about 1 μm in which metal particles are deposited, for example. The thin film electrode layer is able to be formed by a known thin film forming method, for example, a sputtering method or a vapor deposition method.

The plating layer provided on the underlying electrode layer includes one metal selected from a group consisting of Ni, Cu, Ag, Pd and Au, or an alloy including the metal, for example. For example, the plating layer includes an alloy of Ag and Pd or the like. One plating layer or a plurality of plating layers may be provided. The plating layer preferably has a two-layer structure in which a Sn plating layer is formed on a Ni plating layer, for example. The Ni plating layer significantly reduces or prevents erosion of the underlying electrode layer by a solder when mounting capacitor chip 100. The Sn plating layer significantly increases solder wettability when mounting capacitor chip 100.

Each of first outer electrode 120 and second outer electrode 130 may include no underlying electrode layer and may be defined by a plating layer directly provided on multilayer body 110. Accordingly, the plating layer is directly connected to first inner electrode layer 151 or second inner electrode layer 152. The ratio of the metal of the plating layer per unit volume is preferably more than or equal to about 99 volume %, for example. Further, the plating layer preferably includes no glass, for example.

As shown in FIGS. 1 and 2, each of only one first supporting terminal 11 and only one second supporting terminal 12 supports capacitor chip 100 and extends helically along the axial direction. That is, each of first supporting terminal 11 and second supporting terminal 12 is defined by a winding. As shown in FIG. 2, each of the axial direction of winding axis 11x of first supporting terminal 11 and the axial direction of winding axis 12x of second supporting terminal 12 is along height direction T.

As shown in FIGS. 1 and 2, circuit board 1 has a first land 2 connected to first supporting terminal 11 and a second land 3 connected to second supporting terminal 12.

Figure 3:
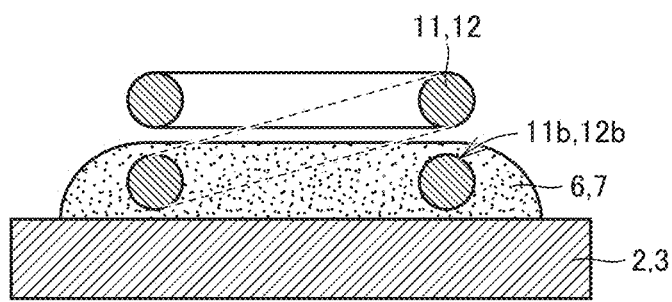
FIG. 3 is an enlarged longitudinal cross sectional view showing each of a connection position between a first supporting terminal and a first land and a connection position between a second supporting terminal and a second land in the mounted structure of the supporting-terminal-equipped capacitor chip according to the first preferred embodiment of the present invention.
Figure 4:
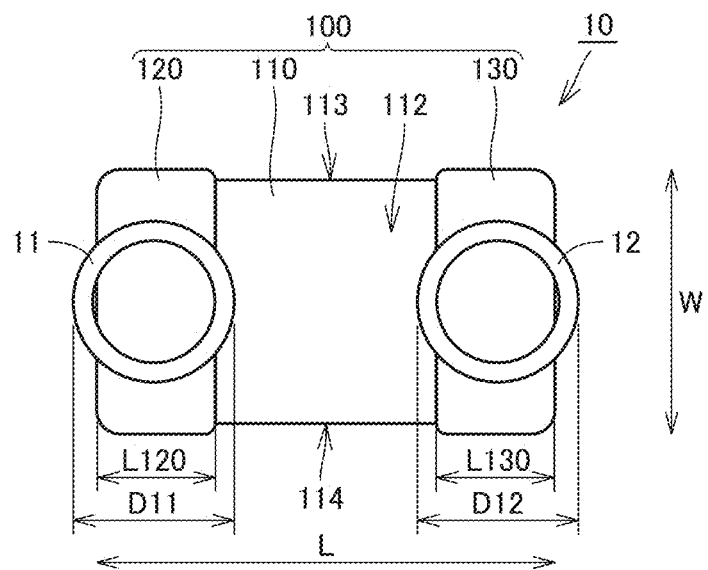
FIG. 4 is a diagram showing the supporting-terminal-equipped capacitor chip according to the first preferred embodiment of the present invention when viewed from the second main surface side.
Figure 5:
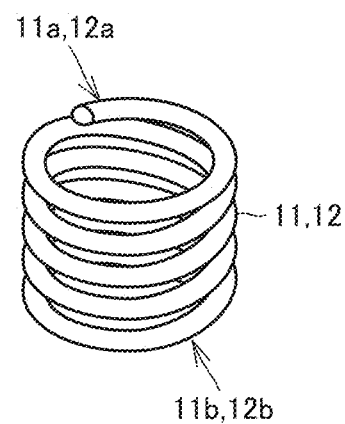
FIG. 5 is a perspective view showing an external appearance of each of the first supporting terminal and the second supporting terminal included in the supporting-terminal-equipped capacitor chip according to the first preferred embodiment of the present invention.

FIG. 3 is an enlarged longitudinal sectional view showing each of a connection position between the first supporting terminal and the first land and a connection position between the second supporting terminal and the second land in the mounted structure of the supporting-terminal-equipped capacitor chip according to the first preferred embodiment of the present invention. FIG. 4 is a diagram showing the supporting-terminal-equipped capacitor chip according to the first preferred embodiment of the present invention when viewed from the second main surface side. FIG. 5 is a perspective view showing an external appearance of each of the first supporting terminal and the second supporting terminal included in the supporting-terminal-equipped capacitor chip according to the first preferred embodiment of the present invention. In FIG. 4, an electrically conductive bonding material 4 and an electrically conductive bonding material 5 described later are not shown.

In the description below, the expression "directly connected by an electrically conductive bonding material" means that components are connected to each other with no element other than the electrically conductive bonding material being provided between the components.

As shown in FIGS. 1 to 3 and 5, a first loop-shaped first end portion 11a of first supporting terminal 11 on a first end side in the axial direction of winding axis 11x is connected to first outer electrode 120 by electrically conductive bonding material 4, and a first loop-shaped second end portion 11b of first supporting terminal 11 on a second end side in the axial direction of winding axis 11x is directly connected to first land 2 by first electrically conductive bonding material 6. First loop-shaped first end portion 11a is a portion of first supporting terminal 11 with a half or more of a turn and less than one turn and is located at a first end in the axial direction of winding axis 11x. First loop-shaped second end portion 11b is a portion of first supporting terminal 11 with a half or more of a turn and less than one turn and is located at a second end in the axial direction of winding axis 11x.

In the first preferred embodiment, first loop-shaped first end portion 11a and first outer electrode 120 are directly connected to each other by electrically conductive bonding material 4. The first loop-shaped first end portion 11a and the first outer electrode 120 may be connected to each other via a first electrically conductive plate.

A second loop-shaped first end portion 12a of second supporting terminal 12 on a first end side in the axial direction of winding axis 12x is connected to second outer electrode 130 by electrically conductive bonding material 5, and a second loop-shaped second end portion 12b of second supporting terminal 12 on a second end side in the axial direction of winding axis 12x is directly connected to second land 3 by second electrically conductive bonding material 7. Second loop-shaped first end portion 12a is a portion of second supporting terminal 12 corresponding to substantially one turn and is located at a first end in the axial direction of winding axis 12x. Second loop-shaped second end portion 12b is a portion of second supporting terminal 12 corresponding to substantially one turn and is located at a second end in the axial direction of winding axis 12x.

In the first preferred embodiment, second loop-shaped first end portion 12a and second outer electrode 130 are directly connected to each other by electrically conductive bonding material 4. The second loop-shaped first end portion 12a and the second outer electrode 130 may be connected to each other via a second electrically conductive plate.

When a solder is included as each of electrically conductive bonding material 4, electrically conductive bonding material 5, first electrically conductive bonding material 6 and second electrically conductive bonding material 7, a lead-free solder, for example, a Sn—Sb-based solder, a Sn—Ag—Cu-based solder, a Sn—Cu-based solder, or a Sn—Bi-based solder is preferably applied. When the Sn—Sb solder is implemented, the content of Sb is preferably about more than or equal to about 5% and less than or equal to about 15%, for example.

As shown in FIG. 4, maximum diameter size D11 of first supporting terminal 11 when viewed in the axial direction of winding axis 11x is larger than maximum length size L120 of the portion of first outer electrode 120 on second main surface 112 in length direction L. In the first preferred embodiment, since first supporting terminal 11 has an annular shape when viewed in the axial direction of winding axis 11x, maximum diameter size D11 of first supporting terminal 11 is equal or substantially equal to the maximum diameter size of first supporting terminal 11 in length direction L. Therefore, the maximum diameter size of first supporting terminal 11 in length direction L is larger than maximum length size L120 of the portion of first outer electrode 120 on second main surface 112 in length direction L.

Similarly, maximum diameter size D12 of second supporting terminal 12 when viewed in the axial direction of winding axis 12x is larger than maximum length size L130 of the portion of second outer electrode 130 on second main surface 112 in length direction L. In the first preferred embodiment, since second supporting terminal 12 has an annular shape when viewed in the axial direction of winding axis 12x, maximum diameter size D12 of second supporting terminal 12 is equal or substantially equal to the maximum diameter size of second supporting terminal 12 in length direction L. Therefore, the maximum diameter size of second supporting terminal 12 in length direction L is larger than maximum length size L130 of the portion of second outer electrode 130 on second main surface 112 in length direction L.

As shown in FIG. 2, in length direction L, winding axis 11x of first supporting terminal 11 is preferably located substantially at the center of a portion of first outer electrode 120 on second main surface 112, and winding axis 12x of second supporting terminal 12 is preferably located substantially at the center of a portion of second outer electrode 130 on second main surface 112, for example.

In supporting-terminal-equipped capacitor chip 10 according to the first preferred embodiment of the present invention, each of first supporting terminal 11 and second supporting terminal 12 is defined by a round wire having a diameter of more than or equal to about 0.1 mm and less than or equal to about 0.5 mm. Each of first supporting terminal 11 and second supporting terminal 12 includes stainless steel or phosphor bronze. Preferably, for example, each of first supporting terminal 11 and second supporting terminal 12 is provided with at least one of Ni plating and Sn plating. However, the wire material of each of first supporting terminal 11 and second supporting terminal 12 is not limited to the above.

In supporting-terminal-equipped capacitor chip 10 according to the first preferred embodiment of the present invention, a relation of L2/L1≥about 0.8 is satisfied, where L1 represents a free length of each of first supporting terminal 11 and second supporting terminal 12 and L2 represents a close contact length of each of first supporting terminal 11 and second supporting terminal 12. The free length of each of first supporting terminal 11 and second supporting terminal 12 is a length thereof in a state in which no load is applied. The close contact length of each of first supporting terminal 11 and second supporting terminal 12 is a length thereof in a state in which all the portions of the wire are brought into contact with each other due to application of a load. The number of turns of each of first supporting terminal 11 and second supporting terminal 12 is preferably more than or equal to about 3 and less than or equal to about 5, for example. However, the condition for the winding length of each of first supporting terminal 11 and second supporting terminal 12 is not limited to the above.

In supporting-terminal-equipped capacitor chip 10 according to the first preferred embodiment of the present invention, the winding directions of first supporting terminal 11 and second supporting terminal 12 may be the same or may be different from each other.

In supporting-terminal-equipped capacitor chip 10 according to the first preferred embodiment of the present invention, capacitor chip 100 is supported by only one first supporting terminal 11 and only one second supporting terminal 12, maximum diameter size D11 of first supporting terminal 11 when viewed in the axial direction of winding axis 11x is larger than maximum length size L120 of the portion of first outer electrode 120 on second main surface 112 in length direction L, and maximum diameter size D12 of second supporting terminal 12 when viewed in the axial direction of winding axis 12x is larger than maximum length size L130 of the portion of second outer electrode 130 on second main surface 112 in length direction L. Thus, with a simple structure as described above, capacitor chip 100 is able to be stably supported while reducing acoustic noise.

In supporting-terminal-equipped capacitor chip 10 according to the first preferred embodiment of the present invention, the maximum diameter size of first supporting terminal 11 in length direction L is larger than maximum length size L120 of the portion of first outer electrode 120 on second main surface 112 in length direction L, and the maximum diameter size of second supporting terminal 12 in length direction L is larger than maximum length size L130 of the portion of second outer electrode 130 on second main surface 112 in length direction L.

Thus, vibration resulting from strain of multilayer body 110 in length direction L when voltage is applied is able to be damped in each of first supporting terminal 11 and second supporting terminal 12, thereby reducing vibration propagated from each of first supporting terminal 11 and second supporting terminal 12 to circuit board 1. As a result, acoustic noise is able to be significantly reduced.

In supporting-terminal-equipped capacitor chip 10 according to the first preferred embodiment of the present invention, the relation of L2/L1≥about 0.8 is satisfied, where L1 represents the free length of each of first supporting terminal 11 and second supporting terminal 12 and L2 represents the close contact length of each of first supporting terminal 11 and second supporting terminal 12. Accordingly, the elastic modulus of each of first supporting terminal 11 and second supporting terminal 12 is able to be significantly reduced to damp vibration, and stability in supporting capacitor chip 100 is able to be provided.

Further, since the number of turns of each of first supporting terminal 11 and second supporting terminal 12 is more than or equal to about 3 and less than or equal to about 5, an inductance of supporting-terminal-equipped capacitor chip 10 is able to be significantly reduced.

In supporting-terminal-equipped capacitor chip 10 according to the first preferred embodiment of the present invention, each of first supporting terminal 11 and second supporting terminal 12 is defined by a round wire having a diameter of more than or equal to about 0.1 mm and less than or equal to about 0.5 mm. Thus, capacitor chip 100 is able to be stably supported by one first supporting terminal 11 and one second supporting terminal 12.

A modification of the first preferred embodiment of the present invention is described below in which a connection between first loop-shaped first end portion 11a and first outer electrode 120 and a connection between second loop-shaped first end portion 12a and second outer electrode 130 are different from the respective connections in the first preferred embodiment.

Figure 6:
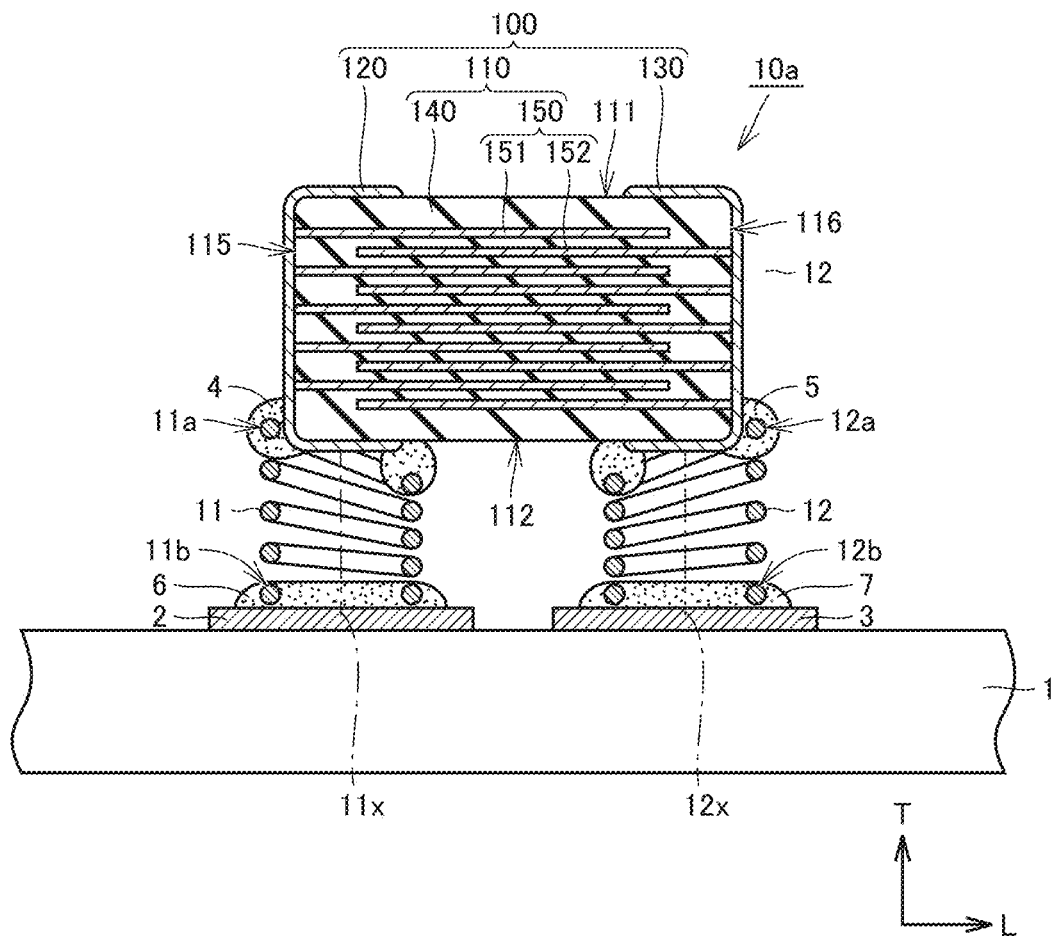
FIG. 6 is a cross sectional view showing a mounted structure of a supporting-terminal-equipped capacitor chip according to a modification of the first preferred embodiment of the present invention.

FIG. 6 is a cross sectional view showing a mounted structure of a supporting-terminal-equipped capacitor chip according to the modification of the first preferred embodiment of the present invention. FIG. 6 shows the cross section similar to the cross section shown in FIG. 2.

As shown in FIG. 6, in a supporting-terminal-equipped capacitor chip 10a according to the modification of the first preferred embodiment of the present invention, a portion of first loop-shaped first end portion 11a is located to face a portion of first outer electrode 120 on second main surface 112, and another portion of first loop-shaped first end portion 11a is located to face a portion of first outer electrode 120 on first end surface 115. Thus, first loop-shaped first end portion 11a of first supporting terminal 11 is connected to each of the portion of first outer electrode 120 on first end surface 115 and the portion of first outer electrode 120 on second main surface 112.

A portion of second loop-shaped first end portion 12a is located to face a portion of second outer electrode 130 on second main surface 112, and another portion of second loop-shaped first end portion 12a is located to face a portion of second outer electrode 130 on second end surface 116. Thus, second loop-shaped first end portion 12a of second supporting terminal 12 is connected to each of the portion of second outer electrode 130 on second end surface 116 and the portion of second outer electrode 130 on second main surface 112.

That is, each of first loop-shaped first end portion 11a and second loop-shaped first end portion 12a is located to be inclined with respect to height direction L to sandwich capacitor chip 100 between the first loop-shaped first end portion 11a and the second loop-shaped first end portion 12a.

Thus, capacitor chip 100 is able to be further stably supported by one first supporting terminal 11 and one second supporting terminal 12.

A supporting-terminal-equipped capacitor chip according to a second preferred embodiment of the present invention is described below. The supporting-terminal-equipped capacitor chip according to the second preferred embodiment of the present invention is different from supporting-terminal-equipped capacitor chip 10 according to the first preferred embodiment of the present invention only in the shape of each of the first supporting terminal and the second supporting terminal. Therefore, the same or similar features as those of supporting-terminal-equipped capacitor chip 10 according to the first preferred embodiment of the present invention will not be repeatedly described.

Figure 7:
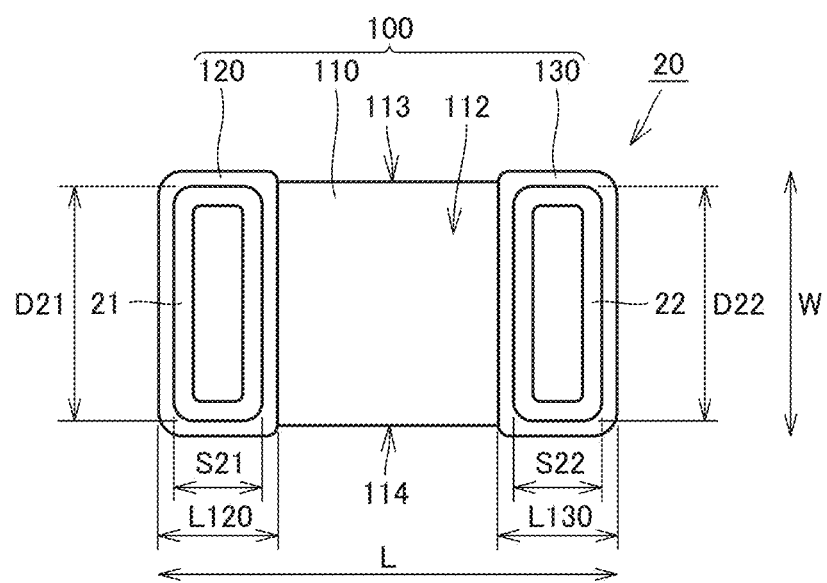
FIG. 7 is a diagram showing a supporting-terminal-equipped capacitor chip according to a second preferred embodiment of the present invention when viewed from the second main surface side.

FIG. 7 is a diagram showing the supporting-terminal-equipped capacitor chip according to the second preferred embodiment of the present invention when viewed from the second main surface side. In FIG. 7, electrically conductive bonding material 4 and electrically conductive bonding material 5 are not shown.

As shown in FIG. 7, supporting-terminal-equipped capacitor chip 20 according to the second preferred embodiment of the present invention includes only one first supporting terminal 21 and only one second supporting terminal 22 that each support capacitor chip 100. Each of the number of first supporting terminals 21 and the number of second supporting terminals 22 is not limited to one. A plurality of first supporting terminals 21 and a plurality of second supporting terminals 22 may be provided.

As shown in FIG. 7, maximum diameter size D21 of first supporting terminal 21 when viewed in the axial direction of the winding axis is larger than maximum length size L120 of the portion of first outer electrode 120 on second main surface 112 in length direction L. In the second preferred embodiment, first supporting terminal 21 has a quadrangular shape when viewed in the axial direction of the winding axis, and maximum diameter size D21 of first supporting terminal 21 is different from maximum diameter size S21 of first supporting terminal 21 in length direction L. Maximum diameter size S21 of first supporting terminal 21 in length direction L is smaller than maximum length size L120 of the portion of first outer electrode 120 on second main surface 112 in length direction L.

Similarly, maximum diameter size D22 of second supporting terminal 22 when viewed in the axial direction of the winding axis is larger than maximum length size L130 of the portion of second outer electrode 130 on second main surface 112 in length direction L. In the second preferred embodiment, second supporting terminal 22 has a quadrangular shape when viewed in the axial direction of the winding axis, and maximum diameter size D22 of second supporting terminal 22 is different from maximum diameter size S22 of second supporting terminal 22 in length direction L. Maximum diameter size S22 of second supporting terminal 22 in length direction L is smaller than maximum length size L130 of the portion of second outer electrode 130 on second main surface 112 in length direction L.

Also in supporting-terminal-equipped capacitor chip 20 according to the second preferred embodiment of the present invention, with a simple structure as described above, capacitor chip 100 is able to be stably supported while reducing acoustic noise. Further, when viewed in the axial direction of the winding axis, first supporting terminal 21 is located at an inner side with respect to the outer edge of the portion of first outer electrode 120 on second main surface 112, and second supporting terminal 22 is located at an inner side with respect to the outer edge of the portion of second outer electrode 130 on second main surface 112. Accordingly, a mounting space for supporting-terminal-equipped capacitor chip 20 is able to be significantly reduced.

Each of a supporting-terminal-equipped capacitor chip and a mounted structure thereof according to a third preferred embodiment of the present invention are described below. The supporting-terminal-equipped capacitor chip according to the third preferred embodiment of the present invention is different from supporting-terminal-equipped capacitor chip 10 according to the first preferred embodiment of the present invention mainly in the shape of each of the first supporting terminal and the second supporting terminal. Therefore, the same or similar features as those of supporting-terminal-equipped capacitor chip 10 according to the first preferred embodiment of the present invention will not be repeatedly described.

Figure 8:
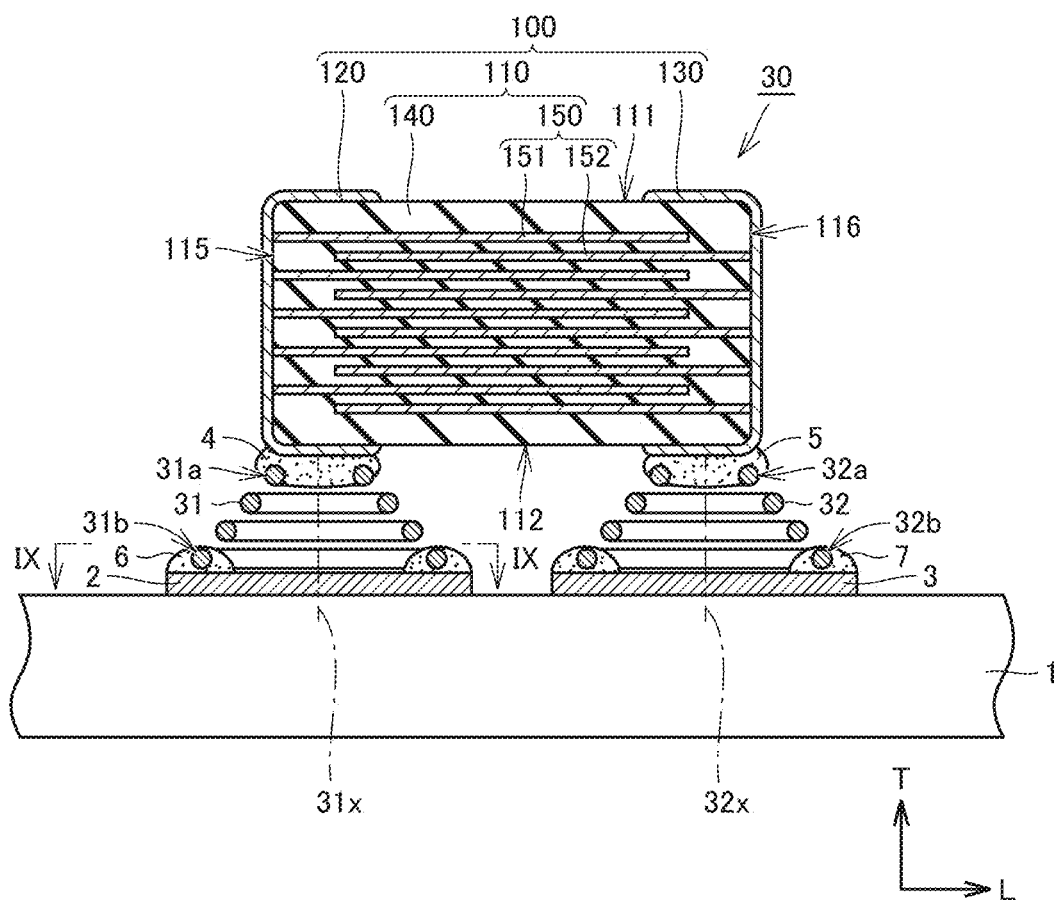
FIG. 8 is a cross sectional view showing a mounted structure of a supporting-terminal-equipped capacitor chip according to a third preferred embodiment of the present invention.
Figure 9:
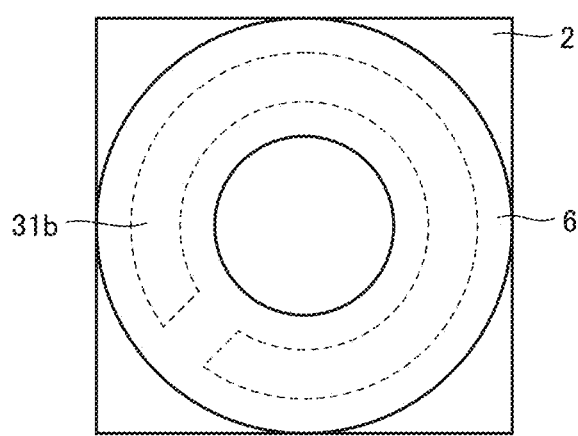
FIG. 9 is a plan view showing the mounted structure of the supporting-terminal-equipped capacitor chip of FIG. 8 when viewed in a direction of a line arrow IX-IX.
Figure 10:
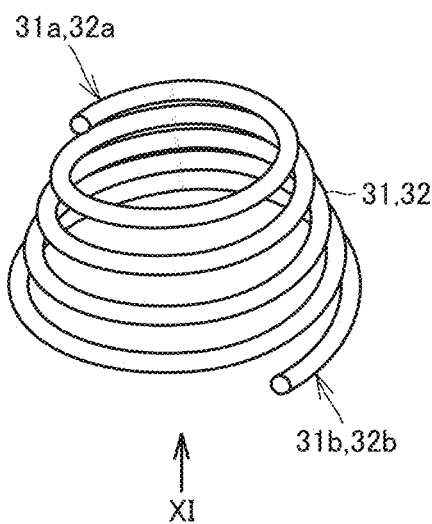
FIG. 10 is a perspective view showing an external appearance of each of a first supporting terminal and a second supporting terminal included in the supporting-terminal-equipped capacitor chip according to the third preferred embodiment of the present invention.
Figure 11:
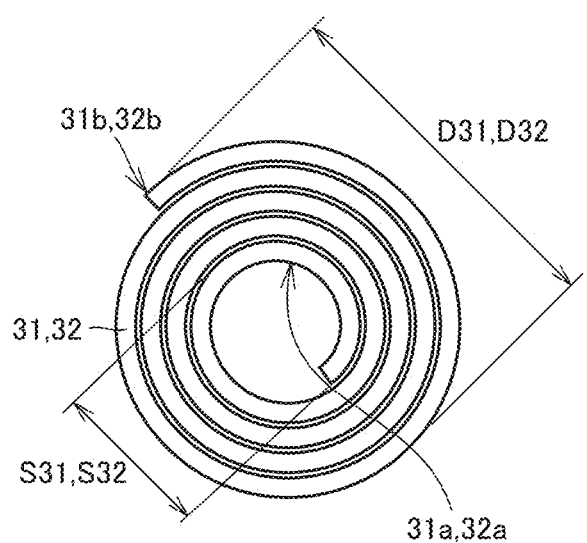
FIG. 11 is a diagram showing the first supporting terminal and the second supporting terminal of FIG. 10 when viewed in a direction of an arrow XI.

FIG. 8 is a cross sectional view showing the mounted structure of the supporting-terminal-equipped capacitor chip according to the third preferred embodiment of the present invention. FIG. 9 is a plan view showing the mounted structure of the supporting-terminal-equipped capacitor chip of FIG. 8 when viewed in a direction of a line arrow IX-IX. FIG. 10 is a perspective view showing an external appearance of each of a first supporting terminal and a second supporting terminal included in the supporting-terminal-equipped capacitor chip according to the third preferred embodiment of the present invention. FIG. 11 is a diagram showing the first supporting terminal and the second supporting terminal of FIG. 10 when viewed in a direction of an arrow XI. FIG. 8 shows the cross section similar to the cross section shown FIG. 2.

As shown in FIGS. 8 to 11, supporting-terminal-equipped capacitor chip 30 according to the third preferred embodiment of the present invention includes only one first supporting terminal 31 and only one second supporting terminal 32 that each support capacitor chip 100. Each of the number of first supporting terminals 31 and the number of second supporting terminals 32 is not limited to one. A plurality of first supporting terminals 31 and a plurality of second supporting terminals 32 may be provided.

The diameter size of first supporting terminal 31 becomes larger from first loop-shaped first end portion 31a toward first loop-shaped second end portion 31b. Therefore, as shown in FIG. 11, when viewed in the axial direction of winding axis 31x, maximum diameter size D31 of first supporting terminal 31 at first loop-shaped second end portion 31b is larger than maximum diameter size S31 of first supporting terminal 31 at first loop-shaped first end portion 31a.

The diameter size of second supporting terminal 32 becomes larger from second loop-shaped first end portion 32a toward second loop-shaped second end portion 32b. Therefore, as shown in FIG. 11, when viewed in the axial direction of winding axis 32x, maximum diameter size D32 of second supporting terminal 32 at second loop-shaped second end portion 32b is larger than maximum diameter size S32 of second supporting terminal 32 at second loop-shaped first end portion 32a.

As shown in FIG. 9, first electrically conductive bonding material 6 is located on first land 2 in an annular shape along the first loop-shaped second end portion 31b of first supporting terminal 31. Similarly, second electrically conductive bonding material 7 is located on second land 3 in an annular shape along the second loop-shaped second end portion 32b of second supporting terminal 32.

A solder resist may be provided on a portion of first land 2 located at an inner side with respect to first electrically conductive bonding material 6 located in the annular shape. A solder resist may be provided on a portion of second land 3 located at an inner side with respect to second electrically conductive bonding material 7 located in the annular shape.

In supporting-terminal-equipped capacitor chip 30 according to the third preferred embodiment of the present invention, maximum diameter D31 of first supporting terminal 31 at first loop-shaped second end portion 31b is larger than maximum diameter S31 of first supporting terminal 31 at first loop-shaped first end portion 31a, and maximum diameter D32 of second supporting terminal 32 at second loop-shaped second end portion 32b is larger than maximum diameter S32 of second supporting terminal 32 at second loop-shaped first end portion 32a.

Thus, each of a contact area between first supporting terminal 31 and electrically conductive bonding material 4 and a contact area between second supporting terminal 32 and electrically conductive bonding material 5 is able to be significantly reduced, thereby reducing the magnitude of vibration propagated from capacitor chip 100 to each of first supporting terminal 31 and second supporting terminal 32 while providing each of a contact area between first supporting terminal 31 and first electrically conductive bonding material 6 and a contact area between second supporting terminal 32 and second electrically conductive bonding material 7 to stably support capacitor chip 100.

In supporting-terminal-equipped capacitor chip 30 according to the third preferred embodiment of the present invention, first electrically conductive bonding material 6 is located on first land 2 in the annular shape along the first loop-shaped second end portion 31b of first supporting terminal 31, and second electrically conductive bonding material 7 is located on second land 3 in the annular shape along the second loop-shaped second end portion 32b of second supporting terminal 32.

Thus, even if at least one of first electrically conductive bonding material 6 and second electrically conductive bonding material 7 is subjected to vibration, impact, or the like to cause a flaw, a crack is able to be significantly reduced or prevented from being developed from the flaw across the diameter length of the annular shape. As a result, connection reliability between first supporting terminal 31 and first land 2 and connection reliability between second supporting terminal 32 and second land 3 is able to be provided.

Each of a supporting-terminal-equipped capacitor chip and a mounted structure thereof according to a fourth preferred embodiment of the present invention are described below. The supporting-terminal-equipped capacitor chip according to the fourth preferred embodiment of the present invention is different from supporting-terminal-equipped capacitor chip 10 according to the first preferred embodiment of the present invention mainly in the shape of each of the first supporting terminal and the second supporting terminal. Therefore, the same or similar features as those of supporting-terminal-equipped capacitor chip 10 according to the first preferred embodiment of the present invention will not be repeatedly described.

Figure 12:
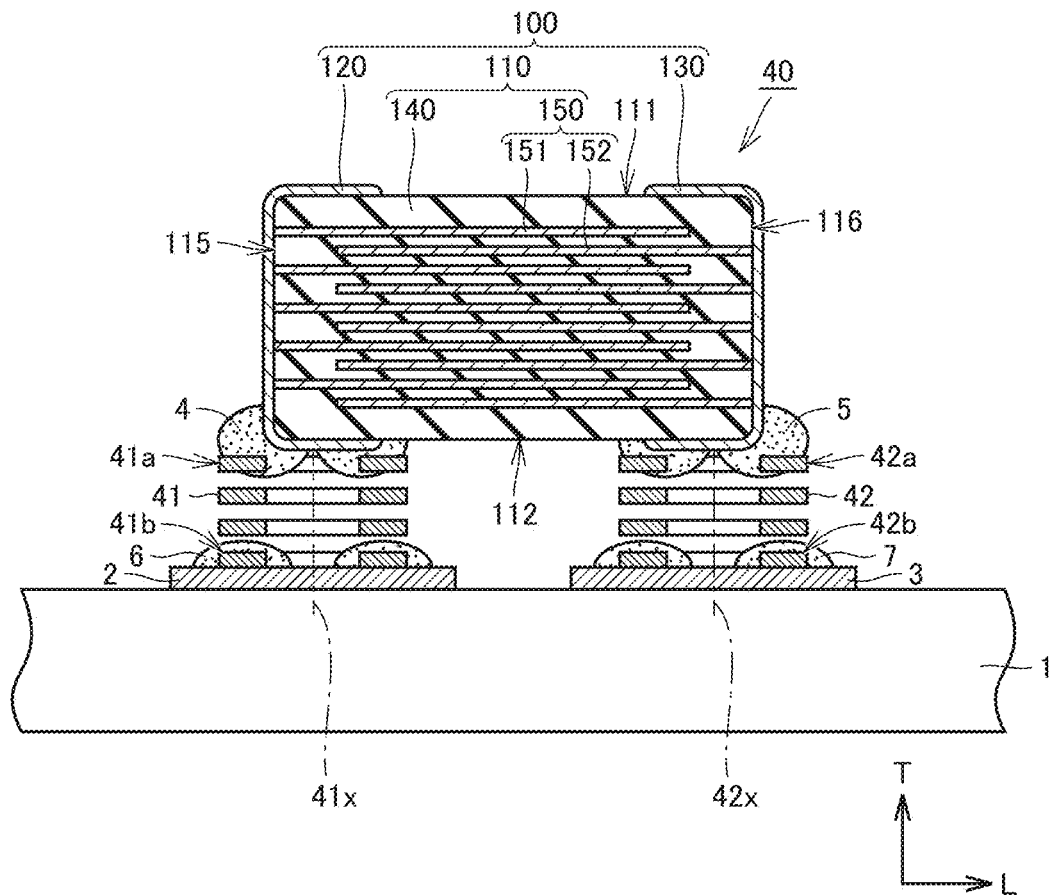
FIG. 12 is a cross sectional view showing a mounted structure of a supporting-terminal-equipped capacitor chip according to a fourth preferred embodiment of the present invention.
Figure 13:
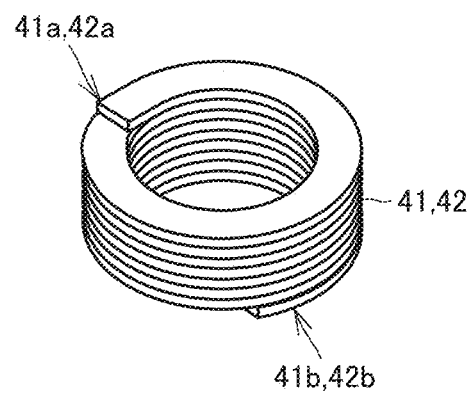
FIG. 13 is a perspective view showing an external appearance of each of a first supporting terminal and a second supporting terminal included in the supporting-terminal-equipped capacitor chip according to the fourth preferred embodiment of the present invention.

FIG. 12 is a cross sectional view showing the mounted structure of the supporting-terminal-equipped capacitor chip according to the fourth preferred embodiment of the present invention. FIG. 13 is a perspective view showing an external appearance of each of a first supporting terminal and a second supporting terminal included in the supporting-terminal-equipped capacitor chip according to the fourth preferred embodiment of the present invention. FIG. 12 shows the cross section similar to the cross section shown FIG. 2.

As shown in FIGS. 12 and 13, supporting-terminal-equipped capacitor chip 40 according to the fourth preferred embodiment of the present invention includes only one first supporting terminal 41 and only one second supporting terminal 42 that each support capacitor chip 100. Each of the number of first supporting terminals 41 and the number of second supporting terminals 42 is not limited to one. A plurality of first supporting terminals 41 and a plurality of second supporting terminals 42 may be provided.

Each of first supporting terminal 41 and second supporting terminal 42 is defined by a flat wire bent in an edgewise direction. First supporting terminal 41 extends helically along the axial direction of winding axis 41x. Second supporting terminal 42 extends helically along the axial direction of winding axis 42x.

Since each of first supporting terminal 41 and second supporting terminal 42 is defined by a flat wire, capacitor chip 100 is able to be stably placed on first loop-shaped first end portion 41a and second loop-shaped first end portion 42a. Moreover, by placing first loop-shaped second end portion 41b on first land 2 and placing second loop-shaped second end portion 42b on second land 3, capacitor chip 100 is able to be stably supported by one first supporting terminal 41 and one second supporting terminal 42.

In the description of the preferred embodiments described above, features, components, and elements that are able to be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounted structure of a supporting-terminal-equipped capacitor chip, the mounted structure comprising:
   a capacitor chip;
   a first supporting terminal and a second supporting terminal that each support the capacitor chip, that each extend helically along an axial direction, and that each have electric conductivity; and
   a circuit board including a first land connected to the first supporting terminal and a second land connected to the second supporting terminal; wherein
   the capacitor chip includes:
      a multilayer body including:
         a plurality of dielectric layers and a plurality of inner electrode layers alternately layered;
         a first main surface and a second main surface facing each other in a height direction;
         a first side surface and a second side surface facing each other in a width direction orthogonal or substantially orthogonal to the height direction; and
         a first end surface and a second end surface facing each other in a length direction orthogonal or substantially orthogonal to both the height direction and the width direction; and
      a first outer electrode and a second outer electrode each provided at least on the second main surface;
   the second main surface faces the circuit board;
   the plurality of inner electrode layers includes a first inner electrode layer connected to the first outer electrode and a second inner electrode layer connected to the second outer electrode;
   a first loop-shaped first end portion of the first supporting terminal on a first end side in the axial direction is connected to the first outer electrode by a first electrically conductive bonding material, and a first loop-shaped second end portion of the first supporting terminal on a second end side in the axial direction is directly connected to the first land by a second electrically conductive bonding material;
   a second loop-shaped first end portion of the second supporting terminal on a first end side in the axial direction is connected to the second outer electrode by a third electrically conductive bonding material, and a second loop-shaped second end portion of the second supporting terminal on a second end side in the axial direction is directly connected to the second land by a fourth electrically conductive bonding material;

a maximum diameter size of the first supporting terminal when viewed in the axial direction is larger than a maximum length size of a portion of the first outer electrode on the second main surface in the length direction; and a maximum diameter size of the second supporting terminal when viewed in the axial direction is larger than a maximum length size of a portion of the second outer electrode on the second main surface in the length direction.

2. The mounted structure of the supporting-terminal-equipped capacitor chip according to claim 1, wherein a maximum diameter size of the first supporting terminal in the length direction is larger than the maximum length size of the portion of the first outer electrode on the second main surface in the length direction; and a maximum diameter size of the second supporting terminal in the length direction is larger than the maximum length size of the portion of the second outer electrode on the second main surface in the length direction.

3. The mounted structure of the supporting-terminal-equipped capacitor chip according to claim 1, wherein a relation of L2/L1≥about 0.8 is satisfied, where L1 represents a free length of each of the first supporting terminal and the second supporting terminal and L2 represents a close contact length of each of the first supporting terminal and the second supporting terminal.

4. The mounted structure of the supporting-terminal-equipped capacitor chip according to claim 1, wherein the second electrically conductive bonding material is located on the first land in an annular shape along a shape of the first loop-shaped second end portion of the first supporting terminal; and the fourth electrically conductive bonding material is located on the second land in an annular shape along a shape of the second loop-shaped second end portion of the second supporting terminal.

5. The mounted structure of the supporting-terminal-equipped capacitor chip according to claim 1, wherein the first outer electrode extends from the first end surface onto the second main surface;

the second outer electrode extends from the second end surface onto the second main surface;

the first loop-shaped first end portion of the first supporting terminal is connected to each of a portion of the first outer electrode on the first end surface and a portion of the first outer electrode on the second main surface; and the second loop-shaped first end portion of the second supporting terminal is connected to each of a portion of the second outer electrode on the second end surface and a portion of the second outer electrode on the second main surface.

6. The mounted structure of the supporting-terminal-equipped capacitor chip according to claim 1, wherein a maximum diameter size of the first supporting terminal at the first loop-shaped second end portion is larger than a maximum diameter size of the first supporting terminal at the first loop-shaped first end portion; and a maximum diameter size of the second supporting terminal at the second loop-shaped second end portion is larger than a maximum diameter size of the second supporting terminal at the second loop-shaped first end portion.

7. The mounted structure of the supporting-terminal-equipped capacitor chip according to claim 1, wherein each of the first supporting terminal and the second supporting terminal is defined by a round wire having a diameter of more than or equal to about 0.1 mm and less than or equal to about 0.5 mm.

8. The mounted structure of the supporting-terminal-equipped capacitor chip according to claim 1, wherein each of the first supporting terminal and the second supporting terminal is defined by a flat wire bent in an edgewise direction.

9. A supporting-terminal-equipped capacitor chip comprising:

a capacitor chip; and a first supporting terminal and a second supporting terminal that each support the capacitor chip, that each extend helically along an axial direction, and that each have electric conductivity, wherein the capacitor chip includes:

a multilayer body including:

a plurality of dielectric layers and a plurality of inner electrode layers alternately layered;

a first main surface and a second main surface facing each other in a height direction;

a first side surface and a second side surface facing each other in a width direction orthogonal or substantially orthogonal to the height direction; and a first end surface and a second end surface facing each other in a length direction orthogonal or substantially orthogonal to both the height direction and the width direction; and a first outer electrode and a second outer electrode each provided at least on the second main surface;

the plurality of inner electrode layers includes a first inner electrode layer connected to the first outer electrode and a second inner electrode layer connected to the second outer electrode;

a first loop-shaped first end portion of the first supporting terminal in the axial direction is connected to the first outer electrode by a first electrically conductive bonding material;

a second loop-shaped first end portion of the second supporting terminal in the axial direction is connected to the second outer electrode by a second electrically conductive bonding material;

a maximum diameter size of the first supporting terminal when viewed in the axial direction is larger than a maximum length size of a portion of the first outer electrode on the second main surface in the length direction; and a maximum diameter size of the second supporting terminal when viewed in the axial direction is larger than a maximum length size of a portion of the second outer electrode on the second main surface in the length direction.

10. The supporting-terminal-equipped capacitor chip according to claim 9, wherein a maximum diameter size of the first supporting terminal in the length direction is larger than the maximum length size of the portion of the first outer electrode on the second main surface in the length direction; and a maximum diameter size of the second supporting terminal in the length direction is larger than the maximum length size of the portion of the second outer electrode on the second main surface in the length direction.

11. The supporting-terminal-equipped capacitor chip according to claim 9, wherein a relation of L2/L1≥about 0.8 is satisfied, where L1 represents a free length of each of the first supporting terminal and the second supporting terminal and L2 represents a close contact length of each of the first supporting terminal and the second supporting terminal.

12. The supporting-terminal-equipped capacitor chip according to claim 9, wherein
the first outer electrode extends from the first end surface onto the second main surface;
the second outer electrode extends from the second end surface onto the second main surface;
the first loop-shaped first end portion of the first supporting terminal is connected to each of a portion of the first outer electrode on the first end surface and a portion of the first outer electrode on the second main surface; and
the second loop-shaped first end portion of the second supporting terminal is connected to each of a portion of the second outer electrode on the second end surface and a portion of the second outer electrode on the second main surface.

13. The supporting-terminal-equipped capacitor chip according to claim 9, wherein
a maximum diameter size of the first supporting terminal at a first loop-shaped second end portion opposite to the first loop-shaped first end portion of the first supporting terminal is larger than a maximum diameter size of the first supporting terminal at the first loop-shaped first end portion; and
a maximum diameter size of the second supporting terminal at a second loop-shaped second end portion opposite to the second loop-shaped first end portion of the second supporting terminal is larger than a maximum diameter size of the second supporting terminal at the second loop-shaped first end portion.

14. The supporting-terminal-equipped capacitor chip according to claim 9, wherein each of the first supporting terminal and the second supporting terminal is defined by a round wire with a diameter of more than or equal to about 0.1 mm and less than or equal to about 0.5 mm.

15. The supporting-terminal-equipped capacitor chip according to claim 9, wherein each of the first supporting terminal and the second supporting terminal is defined by a flat wire bent in an edgewise direction.

16. The mounted structure of the supporting-terminal-equipped capacitor chip according to claim 1, wherein a number of turns of each of the first supporting terminal and the second supporting terminal is between about 3 and about 5.

17. The mounted structure of the supporting-terminal-equipped capacitor chip according to claim 1, wherein at least one of the first electrically conductive bonding material, the second electrically conductive bonding material, the third electrically conductive bonding material, and the fourth electrically conductive bonding material includes solder.

18. The mounted structure of the supporting-terminal-equipped capacitor chip according to claim 1, wherein each of the first loop-shaped first end portion of the first supporting terminal and the second loop-shaped first end portion of the second supporting terminal is inclined with respect to the height direction.

* * * * *